(12) United States Patent
Brown et al.

(10) Patent No.: US 6,642,548 B1
(45) Date of Patent: Nov. 4, 2003

(54) LIGHT-EMITTING DIODES WITH LOOP AND STRIP ELECTRODES AND WITH WIDE MEDIAL SECTIONS

(75) Inventors: Michael G. Brown, Valerico, FL (US); Ivan Eliashevich, South Orange, NJ (US); Louis A. Koszi, Fogelsville, PA (US)

(73) Assignee: Emcore Corporation, Somerset, NJ (US)

( * ) Notice: Subject to any disclaimer, the term of this patent is extended or adjusted under 35 U.S.C. 154(b) by 66 days.

(21) Appl. No.: 09/692,953

(22) Filed: Oct. 20, 2000

(51) Int. Cl.[7] ................................................ H01L 33/00
(52) U.S. Cl. ......................................... 257/99; 257/91
(58) Field of Search ............................ 257/91, 99, 103, 257/744, 745

(56) References Cited

U.S. PATENT DOCUMENTS

| | | | |
|---|---|---|---|
| 5,369,289 A | | 11/1994 | Tamaki et al. |
| 5,557,115 A | | 9/1996 | Shakuda |
| 5,563,422 A | | 10/1996 | Nakamura et al. |
| 5,696,389 A | * | 12/1997 | Ishikawa et al. ............... 257/99 |
| 5,777,350 A | | 7/1998 | Nakamura et al. |
| 5,825,052 A | | 10/1998 | Shakuda |
| 5,838,029 A | | 11/1998 | Shakuda |
| 5,877,558 A | | 3/1999 | Nakamura et al. |
| 5,880,486 A | | 3/1999 | Nakamura et al. |
| 6,268,618 B1 | | 7/2001 | Miki et al. |
| 6,307,218 B1 | | 10/2001 | Steigerwald et al. |
| 6,445,007 B1 | * | 9/2002 | Wu et al. ...................... 257/91 |

OTHER PUBLICATIONS

Ivaneliashevich, GELcore, Somerset, NJ, Improved Current Spreading in High–Power InGaN LEDs, Compound Semi-conductor 6(3) Apr. 2000, pp. 1–3.

"Improved Current Spreading in High–Power InGaN LEDs", I. Eliashevich, Compound Semiconductor 6(3), Apr. 2000.

* cited by examiner

*Primary Examiner*—Minh Loan Tran
(74) *Attorney, Agent, or Firm*—Lerner, David, Littenberg, Krumholz & Mentlik, LLP (57) ABSTRACT

Light emitting diodes such as those formed from gallium nitride based semiconductors are provided with electrode and pad structures which facilitate current spreading. The LED may be formed as a die with a lower contact surface and a mesa projecting upwardly from the lower contact surface. An electrode on the lower contact surface may be in the form of a ring substantially encircling the mesa. In other arrangements, the pad and/or electrode on the lower contact surface is disposed in an indentation on one edge of the mesa whereas the pad on the top of the mesa is disposed adjacent the opposite edge of the mesa.

31 Claims, 4 Drawing Sheets

LIGHT-EMITTING DIODES WITH LOOP AND STRIP ELECTRODES AND WITH WIDE MEDIAL SECTIONS

FIELD OF THE INVENTION

The present invention relates to optoelectronic devices such as light-emitting diodes.

BACKGROUND OF THE INVENTION

Light emitting diodes or "LEDs" include thin layers of semiconductor material of two opposite conductivity types, referred to as p-type and n-type. The layers are disposed in a stack, one above the other, with one or more layers of n-type material in one part of the stack and one or more layers of p-type material at the other end of the stack. For example, the various layers may be deposited in sequence on a substrate to form a wafer. The wafer is then cut apart to form individual dies which constitute separate LEDs. The junction between the p-type and n-type material may include directly abutting p-type and n-type layers, or may include one or more intermediate layers which may be of any conductivity type or which may have no distinct conductivity type. In operation, electric current passing through the diode is carried principally by electrons in the n-type layers and by electron vacancies or "holes" in the p-type layers. The electrons and holes move in opposite directions toward the junction, and recombine with one another at the junction. Energy released by electron-hole recombination is emitted as light. As used in this disclosure, the term "light" radiation includes infrared and ultraviolet wavelength range, as well as the visible range. The wavelength of the light depends on factors including the composition of the semiconductor materials and the structure of the junction.

Electrodes are connected to the n-type and p-type layers near the top and bottom of the stack. The materials in the electrodes are selected to provide low-resistance interfaces with the semiconductor materials. The electrodes, in turn, are provided with pads suitable for connection to wires or other conductors which carry current from external sources. The pad associated with each electrode may be a part of the electrode, having the same composition and thickness of the electrode, or may be a distinct structure which differs in thickness, composition, or both from the electrode itself. The term "electrode-pad unit" is used in this disclosure to refer to the electrode and pad, regardless of whether the pad is a separate structure or merely a region of the electrode.

Some LEDs have electrodes on the bottom surface of the bottom semiconductor layer. For example, the various layers may be deposited in sequence on an electrically conductive substrate, and the substrate may be left in place on the bottom surface to act as a bottom electrode. However, LEDs formed from certain semiconductor materials normally use nonconductive substrates to promote proper formation of the semiconductor layers. The nonconductive substrate typically is left in place, so that an electrode cannot be provided on the bottom surface of the bottom layer. For example, gallium nitride-based materials such as GaN, AlGaN, InGaN and AlInGaN are used to form LEDs emitting light in various wavelength ranges including blue and ultraviolet. These materials typically are grown on insulating substrates such as sapphire or alumina.

LEDs incorporating an insulating substrate must include a bottom electrode at a location on the stack above the substrate but below the junction. Typically, the upper layer or layers of the stack are removed in a region covering part of the area of each die after formation of the stack, so as to provide an upwardly-facing lower electrode surface on a layer at or near the middle of the stack in each die. This leaves a region referred to as a "mesa" projecting upwardly from the lower electrode surface and covering the remaining area of the die. The area of the die occupied by the lower electrode surface does not emit light. It is desirable to keep the horizontal extent of this inactive area as small as possible.

The top electrode typically is formed on the top surface of the stack, i.e., the top surface of the top semiconductor layer. Typically, the layers in the stack above the junction are transparent, so that light emitted at the junction can pass out of the stack through the top surface. The top electrode is arranged so that it does not block all of the emitted light. For example, an opaque top electrode may cover only a small portion of the top surface of each die. However, the current passing from such an electrode will tend to flow downwardly through the stack so that the current passes predominantly through the area of the junction disposed beneath the electrode. This phenomenon, referred to as "current crowding", results in light emission concentrated in that area of the junction beneath the electrode, precisely where it will be most effectively blocked by the electrode. The amount of useful light reaching the outside of the die per unit of electrical current passing through the die, commonly stated as the external quantum efficiency of the die, is reduced by this phenomenon. Current crowding can also occur in the lower region, so that light emission is concentrated in the area of the junction near the lower electrode. Current crowding is a significant consideration with LEDs formed from materials having relatively high electrical resistivity, such as the gallium nitride-based materials.

To alleviate the current crowding problem, LEDs have been provided with transparent top electrodes, formed from thin layers of metals and metal compounds. A pad, which is typically opaque, occupies a small portion of the top surface. The transparent top electrode spreads the current in horizontal directions from the pad, so that current flow down through the stack is spread more evenly over the horizontal extent of the mesa. However, the top electrode normally must be quite thin in order to make it transparent and minimize the amount of light absorbed by the electrode. Therefore, the transparent electrode typically has appreciable resistance to current flow in the horizontal directions. There may still be significant current crowding in the area beneath the pad of the top electrode.

U.S. Pat. No. 5,563,422 suggests placing the pad of a top transparent electrode at one corner of a square die and forming the lower pad region by removing the upper portion of the stack at the diagonally opposite corner of the die. This assertedly results in a relatively even current distribution over the horizontal extent of the mesa. However, there are still needs for further improvements and alternative arrangements.

SUMMARY OF THE INVENTION

The present invention addresses these needs.

One aspect of the invention provides a light-emitting diode which includes a stacked structure. The stacked structure incorporates a first region of a first conductivity type, a second region of a second conductivity type and a light-emitting p-n junction between these regions. The stacked structure defines a lower contact surface and a mesa projecting upwardly from the lower contact surface. The first-type region is disposed in the mesa and defines a top surface of the mesa. The second-type region defines the lower contact surface. In a light-emitting diode according to this aspect of the invention, the lower contact surface substantially surrounds the mesa. The diode desirably includes a lower electrode-pad unit incorporating a lower electrode in contact with the lower contact surface. Most preferably, the lower electrode substantially surrounds the mesa. A top electrode-pad unit incorporates a top pad overlying only a portion of the top surface of the mesa.

As further discussed below, the lower electrode substantially surrounding the mesa promotes current spreading from the top pad in substantially all horizontal directions, and thus promotes more uniform current distribution at the junction.

Preferably, the top electrode-pad unit includes a transparent top electrode overlying at least a major portion of the top surface of the mesa, the transparent electrode being in contact with the first-type region at said top surface. The top pad desirably covers only a small portion of the transparent electrode. In a particularly preferred arrangement, the top pad is disposed adjacent the center of the top surface of the mesa.

A further aspect of the invention provides a diode including a stack structure similar to that discussed above, but has a lower electrode-pad unit including a lower electrode generally in the form of an elongated strip with its length extending in a first horizontal direction. For example, the lower contact surface may be in the form of a ledge extending adjacent to one edge of the mesa, and the lower electrode may extend lengthwise along this ledge. The diode according to this aspect of the invention desirably includes a top electrode-pad unit incorporating a top pad. The top pad overlies only a small portion of said mesa top surface. Preferably, the top pad is in the form of a spot, and has an extent in the first horizontal direction substantially less than the length of the lower electrode. In a particularly preferred arrangement, the top pad is disposed adjacent to the edge of the mesa furthest from the lower electrode. This top pad may be aligned with the midpoint of the lower electrode. For example, in a rectangular die, the lower electrode may extend parallel to one edge of the mesa, along substantially the entire length of that edge, whereas the top pad may be disposed adjacent the opposite edge of the mesa, near the midpoint of such edge. Dies according to this aspect of the invention promote current spreading, while using a lower contact surface which does not occupy a large portion of the die area.

A die according to a further aspect of the invention also includes a stack structure similar to those discussed above. However, the die according to this aspect of the invention has an indentation in the mesa at one edge, referred to as the near edge, the indentation being disposed adjacent the midpoint of the near edge and extending downwardly from the top surface to the lower contact surface, so that the floor of the indentation forms part or all of the lower contact surface. In a die according to this aspect of the invention, the top pad overlying only a portion of said top surface adjacent the midpoint of an edge opposite from the near edge, referred to as the far edge. The lower electrode-pad unit includes a lower pad having an extent in the direction of the near edge substantially shorter than said near edge. The lower pad is disposed at least partially in the indentation, and most preferably is disposed entirely within the indentation. The die according to this aspect of the invention minimizes the area occupied by the lower contact surface.

DETAILED DESCRIPTION OF THE PREFERRED EMBODIMENTS

Figure 1:
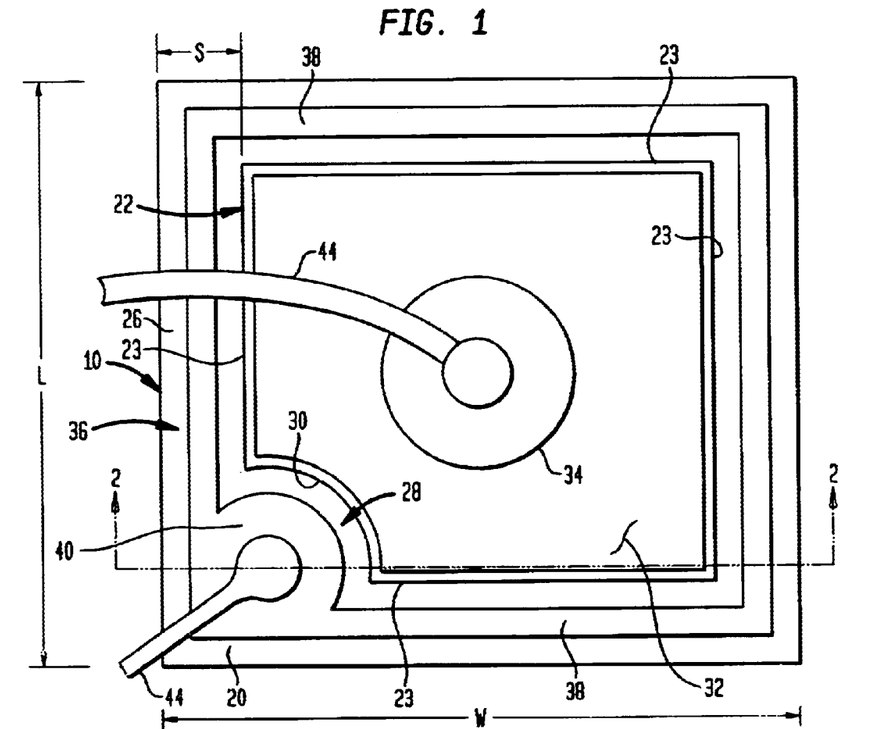
FIG. 1 is a top plan view of an LED in accordance with one embodiment of the invention.
Figure 2:
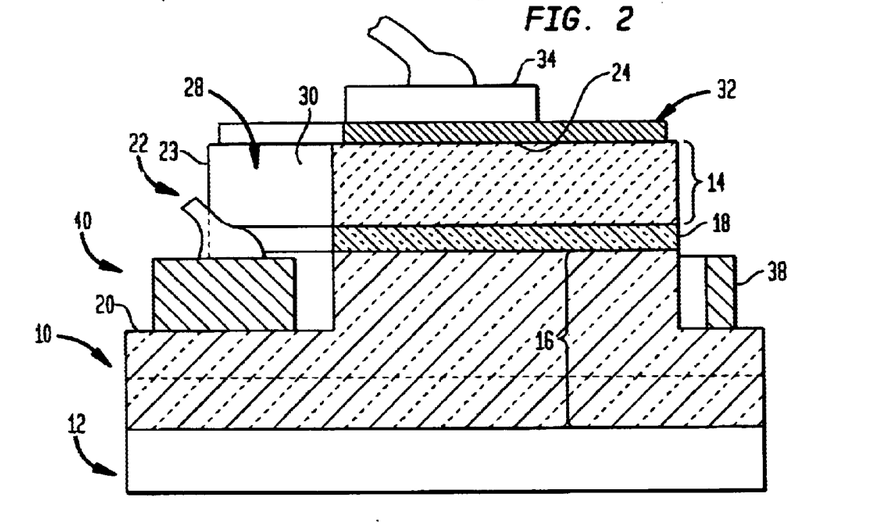
FIG. 2 is a front elevational view of the LED depicted in FIG. 1.

An LED in accordance with one embodiment of the invention includes a stacked structure of semiconductor layers 10 on a substrate 12. The stacked structure includes semiconductor material of a first conductivity type in a first or upper region 14 of the stack and material of a second, opposite conductivity type in a second or lower region adjacent substrate 12. For example, the first or upper region may be formed from a p-type semiconductor whereas the second or lower region 16 may be formed from an n-type semiconductor. The semiconductors may be III-V semiconductors, i.e., materials according to the stoichiometric formula $Al_a In_b Ga_c N_x As_y P_z$ where (a+b+c) is about 1 and (x+y+z) is also about 1. Most typically, the semiconductor materials are nitride semiconductors, i.e., III-V semiconductors in which x is 0.5 or more, most typically about 0.8 or more. Most commonly, the semiconductor materials are pure nitride semiconductors, i.e., nitride semiconductors in which x is about 1.0. The term "gallium nitride based semiconductor" as used herein refers to a nitride based semiconductor including gallium. The p-type and n-type conductivity may be imparted by conventional dopants and may also result from the inherent conductivity type of the particular semiconductor material. For example, gallium nitride based semiconductors typically are inherently n-type even when undoped. n-type nitride semiconductors may include conventional electron donor dopants such as Si, Ge, S, and O, whereas p-type nitride semiconductors may include conventional electron acceptor dopants such as Mg and Zn.

The stacked structure 10 includes a junction 18 between the first and second regions. The junction is symbolized in FIG. 2 as a discrete layer interposed between regions 14 and 16. In practice, the first and second regions may abut one another so that they define the junction at their mutual border. Alternatively, the junction may include additional layer structures in the mutually adjacent portions of regions 14 and 16 or between these regions. Thus, the junction may be a simple homojunction; a single heterojunction, a double heterojunction, a single quantum well, a multiple quantum well or any other type of junction structure.

Also, each of regions 14 and 16 can include any number of layers. Merely by way of example, the second or lower region may incorporate a "buffer layer" at the interface with substrate 12, whereas the first or upper region may incorporate a highly doped contact layer at the top of the stack to aid in establishing ohmic contact with a top electrode discussed below. The top or first region 14 typically is transparent to light at the wavelength which will be emitted by the LED in service. That is, the upper region is formed entirely or principally from materials having a band gap greater than the energy of the photons which will be emitted at the junction. The structure and composition of the various layers incorporated in the stack and the sequence of layers in the stack may be selected according to known principles and techniques to provide the desired emission characteristics. The fabrication processes used to form the stacked structure are also well known. Most commonly, the various layers which form the stacked structure are deposited on the substrate in sequence by techniques such as metal organic chemical vapor deposition ("MOCVD") molecular beam epitaxy and the like.

The second or lower region 16 defines a second or lower region contact surface 20. Surface 20 faces upwardly, away from substrate 12. The stacked structure also defines a mesa 22 projecting upwardly from the second or lower region contact surface 20. The junction 18 and the first region 14 are disposed within the mesa 22. The first region 14 defines the top surface 24 of the mesa. Typically, the lower region contact surface 20 and mesa 22 are formed by an etching process after the layers which form the stacked structure have been deposited on the substrate. Thus, the layers which form the upper region 14 and junction 18, and a portion of the layer or layers which form the lower region 16 are removed by selectively etching in those areas of the die which are to form the lower region contact surface, whereas these regions are not etched away in those areas of the die which are to form the mesa. Such an etching process may use, for example, conventional photolithographic masking techniques. Alternatively, the lower region contact surface and mesa are defined by selective deposition. In a selective deposition process, the areas of the die which are to form the lower region contact surface are covered with a masking material or otherwise protected from the deposition process, so that the uppermost layers in the stack are not formed in these areas.

It should be appreciated that the figures are not drawn to scale. In particular, the thicknesses of the various layers have been greatly exaggerated for clarity of illustration. Typically, the entire stack including mesa 22 is on the order of five microns thick. The horizontal dimensions of the die, such as the overall die width W and die length L are on the order of a few hundred microns as, for example, about 200–300 microns. The die is typically rectangular or, most preferably, square with equal width and length.

The shape of mesa 22, when seen in top plan view as in FIG. 1, is substantially similar to the overall shape of the die. Thus, around the perimeter of the die, the vertically extensive wall of mesa 22 extends in horizontal directions generally parallel to the adjacent edge of the die, so that the lower contact surface includes strip-like regions 26 extending around the perimeter of the mesa. The width S of the strip is made as small as possible while still providing room to accommodate the lower electrode-pad unit discussed below. Typically, the width S of the strip is on the order of 10–50 microns. The mesa has an indentation 28 at one corner. The indentation extends downwardly from the top surface 24 of the mesa to the lower region contact surface 20 and extends inwardly from the walls 23 defining the edges of the mesa, so that the vertically extensive wall 30 of the mesa defining the indentation joins with the walls 23 defining the edges of the mesa. Thus, the lower region contact surface 20 includes a portion defining the floor of indentation 28. This portion merges with the strip 26 (FIG. 1) of the lower region contact surface. Indentation 28, when seen in top plan view, is generally in the form of a quarter-circle, having a radius of, for example, about 100 microns or so.

A first or top electrode-pad includes a transparent top electrode 32 covering substantially the entire top surface 24 of the mesa. The top electrode is formed from a material which will provide a low resistance, desirably ohmic contact with the semiconductor material of the first or upper region 14 defining the upper surface 24 of the mesa. The composition and thickness of the transparent top electrode are selected to provide substantial transparency to light at the wavelength which will be emitted by the LED in service. Suitable materials, thicknesses and processing techniques for forming transparent electrodes to be used with particular semiconductor materials are well known. Merely by way of example, one suitable top electrode for use where the upper surface 24 is defined by p-type gallium nitride can be formed by applying a layer of nickel, typically about 10 to about 500 Å thick and a layer of gold, typically about 10 to about 500 Å thick, onto the top surface and annealing the contact in an oxidizing atmosphere at an elevated temperature as, for example, about 300–900° C. so as to oxidize the nickel.

The top electrode-pad unit also includes a top pad 34 formed on the top surface of top electrode 32 at or near the horizontal center of the mesa, i.e., near the center of the square top surface of the mesa. Pad 30 is formed from appropriate materials to provide a terminal which can be connected to an external lead in service as, for example, by wire bonding the lead to the pad. The materials of the pad should also be compatible with the materials in top electrode 32. Merely by way of example, top pad 34 may include a layer of titanium overlying the transparent electrode; a layer of platinum overlying the titanium layer and a layer of gold overlying the platinum layer. The exposed layer of gold provides a suitable surface for wire bonding. The top pad 34 typically has a diameter of about 100–120 microns. Desirably, this pad is as small as possible consistent with the requirements of the bonding operation used to connect the pad to external circuitry. Thus, the top pad desirably occupies less than about 10 percent of the mesa top surface.

A second or lower electrode-pad unit 36 is provided on the lower region contact surface 20. This electrode-pad unit includes a partially circular pad region 40 extending into indentation 28 of the mesa and elongated, strip-like regions 38 extending from the pad region along the strip-like regions 26 of the lower region contact surface. The elongated strip-like portions 38 extend entirely around mesa 22. Pad region 40 may be, for example, about 100 microns wide, whereas strip regions 38 may be about 3 to about 20 microns wide. Strip regions 38 provide a lower electrode in contact with the lower region contact surface 20. The strip regions are formed from electrically conductive materials which make a good, desirably ohmic electrical contact with the lower region contact surface 20. For example, where the lower region contact surface 20 is formed by n-type gallium nitride, the strip regions may be formed from layers of aluminum and titanium which are annealed at an elevated temperature. Pad region 40 may also serve as part of the electrode and may include the same layers of aluminum and titanium. The pad region also includes layers adapted for bonding to external leads or other structures. For example, the electrode region may include a layer of platinum over the titanium and aluminum layers and a layer of gold over the platinum layer. The gold layer provides a good bonding surface. In a particularly preferred arrangement for use with gallium nitride-based semiconductors, the entire lower electrode pad unit, including pad region 40 and strip-like electrode regions 38 is formed from layers of aluminum, titanium, platinum and gold, deposited in that order and then annealed.

The entire stacked structure, apart from lower pad 40 and upper pad 34 may be covered by a transparent, electrically insulating material such as a silicon oxide (not shown) to protect the device.

In use, the top pad 34 and lower pad 40 are connected by wire bonds 42 and 44 to an external electrical power source. Current flows between pads 34 and 30 through the electrodes and through the stacked structure, so that light is emitted at junction 18. The transparent top electrode and the lower electrode regions 38 surrounding the mesa promote current spreading through the horizontal extent of the mesa and uniform distribution of the current through the horizontal extent of junction 18. The top electrode 32 reduces the resistance to current flow in horizontal directions of the structure disposed above the junction. The lower electrode 38 tends to equalize potential around the periphery of the mesa in the lower region thus further tending to spread the current over the horizontal extent of the junction. Moreover, the lower electrode contacts the lower region over a large perimeter and tends to reduce any tendency to current crowding in the lower region. Regardless of the mechanism of operation, this structure tends to provide efficient operation. It would appear that providing the strip-like regions 26 of the lower contact surface extending around the perimeter of the mesa will reduce the area occupied by the mesa. However, such strip-like regions can be at least partially accommodated in a part of the die area which otherwise would be wasted. In many cases trenches are etched into the wafer from the top surface to facilitate separation of the individual dies from one another. The strip-like regions 26 can be at least partially provided in the area occupied by these trenches.

In a variant of this embodiment, the striplike regions 38 of the lower electrode are interrupted at a point remote from lower pad 40, so that the lower electrode does not entirely surround the mesa. Provided that such an interruption occupies only a limited portion of the perimeter of the mesa, so that the striplike regions still substantially surround the mesa, the current spreading action of the striplike regions will be diminished only slightly. Desirably, the pad together with the striplike regions of the lower electrode which are continuous with the pad occupy at least about 75% of the perimeter of the mesa, and more desirably at least about 85% of the perimeter of the mesa. Where the mesa is polygonal as seen in plan view, the striplike regions continuous with the pad desirably extend along at least some portion of at least 3 sides of the mesa.

Figure 3:
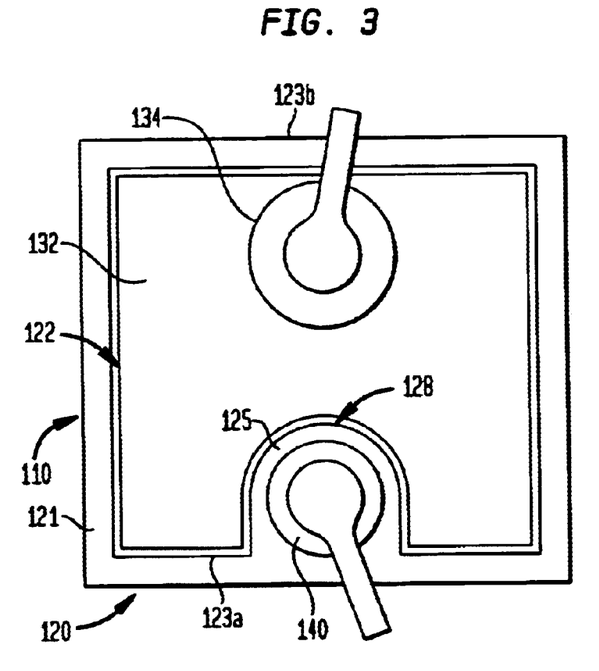
FIG. 3 is a top plan view of an LED in accordance with another embodiment of the invention.

A die 110 in accordance with a further embodiment of the invention (FIG. 3) includes a stacked structure similar to that discussed above with reference to FIGS. 1 and 2. Here again, the lower region of the stacked structure defines an upwardly facing lower contact surface 120 and a mesa 122 projects upwardly from that surface. The mesa has an indentation 128 on one edge of the mesa 123A referred to herein as the "near edge" extending in a first direction (from left to right as seen in FIG. 3). The lower region contact surface 120 includes a portion defining the lower surface or floor of indentation 128. Here, however, the lower electrode pad assembly includes only the pad 140. The lower surface of the pad constitutes the lower electrode. Stated another way, the electrode-pad assembly does not include the strip-like electrode regions 38 discussed above with reference to FIG. 1. Although the stack has strip like regions 121 entirely surrounding the mesa and merging with the floor of indentation 128, these strip-like regions 121 are not covered by the lower electrode-pad unit.

The upper electrode-pad unit includes a transparent top electrode 132 and top pad 134 similar to the corresponding elements discussed above with reference to FIGS. 1 and 2. Here, however, the top pad is disposed adjacent an edge 123b of the mesa, referred to herein as the "far edge", extending parallel to the near edge 123b on the opposite side of the =mesa. Thus, the top pad 134 is disposed remote from the lower pad 140. The indentation 128 and lower pad 140 are disposed adjacent the center of the near edge, whereas the top pad 134 is disposed adjacent the center of the far edge. The arrangement illustrated in FIG. 3 achieves reasonable current spreading even without the strip-like electrode regions. Because the strip-like electrode regions 38 (FIG. 1) are not employed, the lower region contact surface 120 of FIG. 3 may include only very narrow strip-like regions 121 surrounding the mesa. In a further variant, the strip-like regions 121 of surface 120 may be omitted, so that the mesa extends to the outer periphery of the die except at indentation 128 and the lower region contact surface consists only of the area 125 defining the floor of the indentation.

In the arrangements discussed above with reference to FIG. 3, relatively little die area is occupied by the lower region contact surface, leaving a greater proportion of the die area for the mesa. This, in turn, provides a larger active die area, i.e., a junction occupying a greater proportion of the die area. Such a design can be used advantageously to reduce the current density in the junction.

Figure 7:
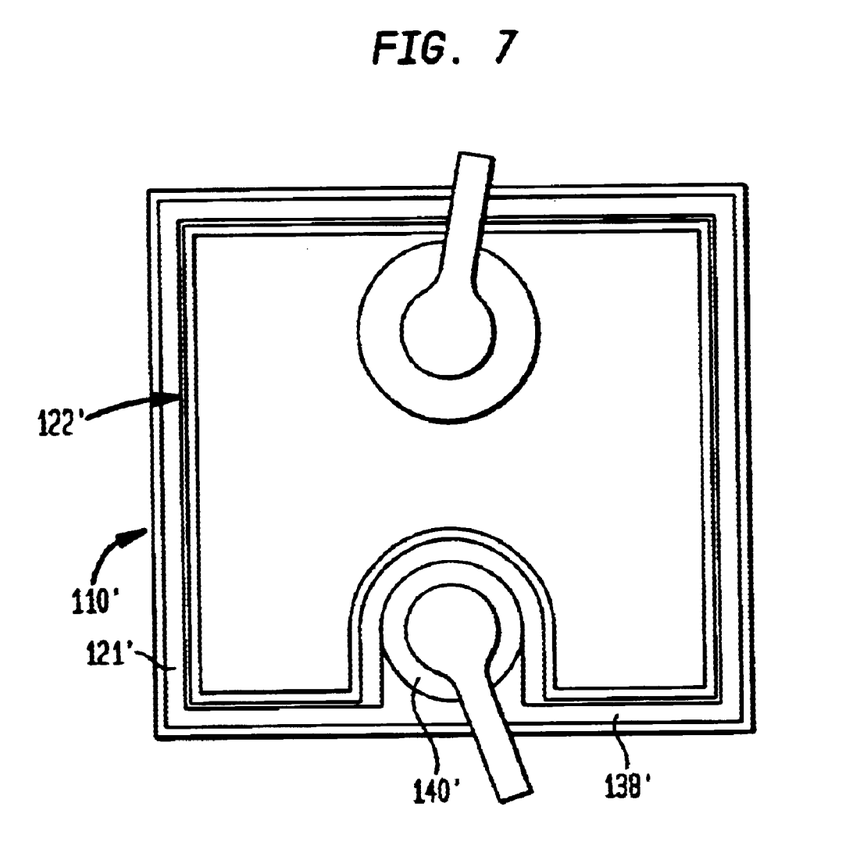
FIG. 7 is a view identical to FIG. 3 but depicting an LED in accordance with yet another embodiment of the invention.

In a further variant, a die as discussed above with reference to FIG. 3 can be provided with strip-like electrode regions 138' (FIG. 7) encircling the mesa 122' on strip-like regions 121', as discussed above with reference to FIG. 1.

Figure 4:
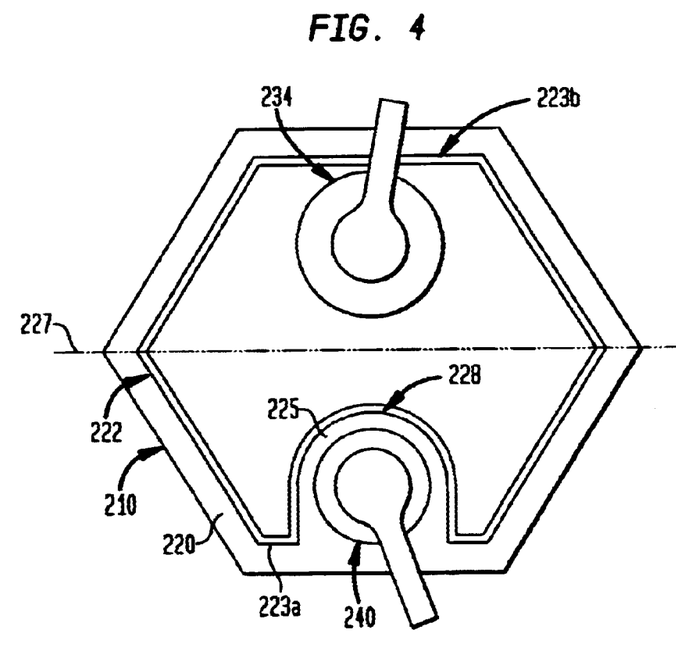
FIG. 4 is a top plan view of an LED in accordance with a further embodiment of the invention.

A die 210 (FIG. 4) in accordance with a further embodiment of the invention is generally hexagonal rather than rectangular or square when seen in plan view. Thus, the die is generally in the form of a hexagonal prism with the top surface of the mesa forming one end surface of the prism. In other respects, the die of FIG. 4 is similar to the die of FIG. 3. Thus, the lower electrode-pad unit includes only a pad 240, the lower surface of the pad serving as the lower electrode. The mesa 222 is also hexagonal when seen in plan view. Here again, the mesa has an indentation 228 extending horizontally inwardly into the mesa from a near edge 223a of the mesa and the lower contact surface 220 includes a region 225 defining the floor of the pad. The lower electrode-pad unit includes only a pad 240 disposed in indentation 228, so that the lower pad is positioned adjacent the center of near edge 223a. The top electrode-pad unit includes a top pad 234 positioned remote from near edge 223a and adjacent a far edge 223b of the mesa, opposite from near edge 223a. Here again, the top electrode-pad unit includes a transparent top electrode 232.

The die of FIG. 4 can be modified in substantially the same ways as discussed above with reference to FIG. 3. For example, the lower electrode-pad unit can include strip-like electrodes such as the strip-like electrode 38 substantially surrounding the mesa. Also, shapes other than hexagonal and rectangular can be employed. For example, the die may be generally triangular, rhomboidal, or octagonal.

Figure 5:
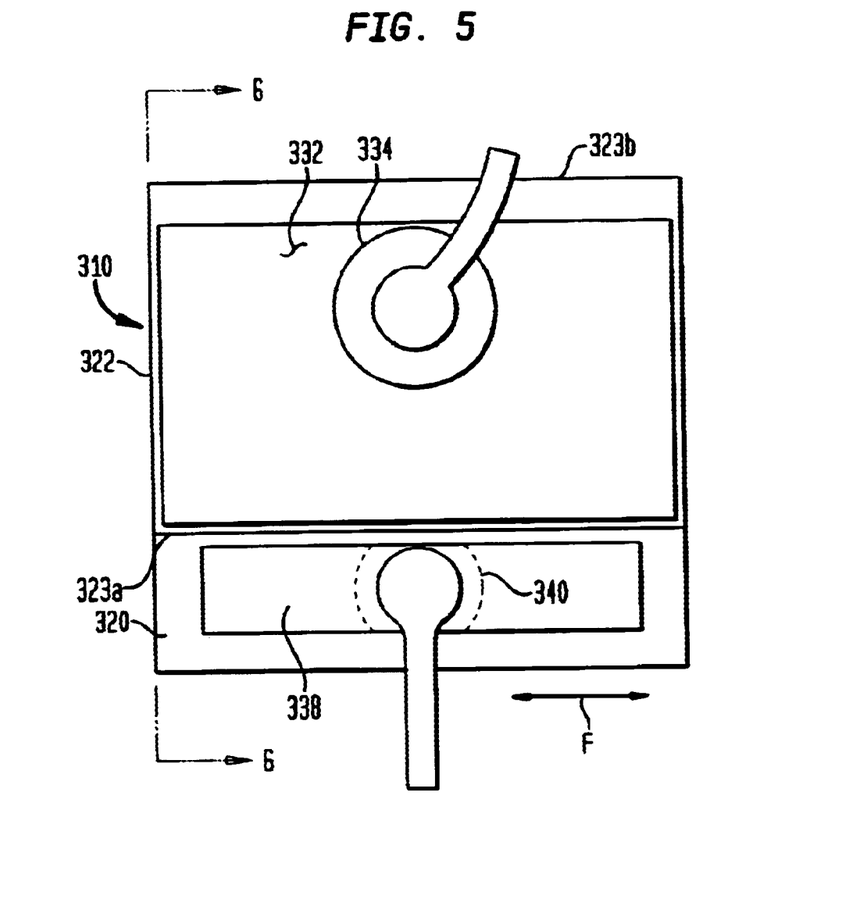
FIG. 5 is a top plan view of an LED in accordance with yet another embodiment of the invention.
Figure 6:
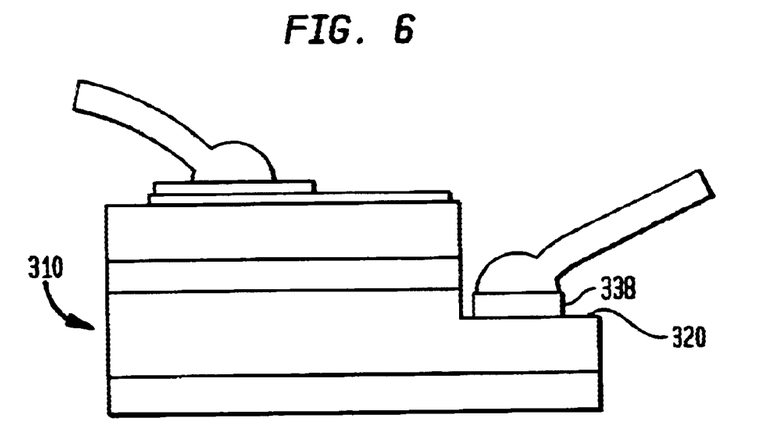
FIG. 6 is a side elevational view of the LED depicted in FIG. 5, taken in the direction indicated by arrows 6—6 in FIG. 5.

A die 310 according to yet another embodiment of the invention includes a lower contact surface 320 in the form of a ledge extending along one edge of the die. The mesa 322 may occupy substantially all of the remaining die area. The lower electrode-pad unit includes an elongated strip-like electrode extending adjacent to and parallel to a near edge 323A of the mesa. The near edge 323a and the elongated strip-like electrode 338 extend in a first horizontal direction F, to the left and right as seen in FIG. 5. A region of this strip-like electrode serves as a pad 340. The pad may or may not be physically distinguishable from the remainder of the electrode 338. That is, the pad may or may not include thicker layers or additional layers of a metallic material. The pad 340 may be disposed at any point along the length of electrode 338, but typically it is adjacent the center of the elongated electrode and hence adjacent the center of the near edge 323a. The top electrode-pad unit includes a top pad 334 and transparent top electrode 332 similar to the corresponding elements discussed above. The top pad 334 is disposed remote from the near edge 323a and remote from the elongated electrode 338. Preferably, the top pad is disposed adjacent a far edge 323b of the mesa and desirably adjacent the center of the far edge. Stated another way, the top pad is aligned, in the first horizontal direction, with the center of the elongated electrode 338. The top pad covers only a small portion of the top surface of the mesa. In particular, the dimension of the top pad in the first direction (parallel to edges 323a and 323b) is substantially smaller than the length of lower electrode 338. Dies according to this design can provide relatively low contact resistance and good current spreading. In a further variant, the lower contact surface may extend along edges of the mesa other than near edge 323a. Thus, the lower electrode contact surface may merge with strip-like regions surrounding the mesa. For example, where the wafer is etched from the top along all edges of the die, to facilitate separation of the die from the wafer, the lower contact surface may include strip-like regions (not shown) extending from ledge 320 entirely around the mesa. However, the lower electrode need not extend onto these strip-like regions, and hence these regions may be narrower than the strip-like regions used in the embodiment of FIGS. 1–2.

The current-spreading effects achieved by structures in accordance with the designs discussed above are particularly useful to counteract current crowding. Current crowding can occur in any region of an LED. The degree of current spreading achieved in LEDs according to the present invention depends in part upon the resistivity of the top transparent top electrode and upper region, in part upon the resistivity of the lower region, and in part upon the configuration of the electrodes. In LED's which incorporate conductive transparent electrodes overlying the upper region, the lateral conductivity of the upper region and transparent electrode together typically are greater than the lateral conductivity of the lower region. Accordingly, there is a greater tendency towards current crowding in the lower region. Where the lower electrode has a very good current spreading effect as, for example, where the lower electrode is in the form of a strip or loop which substantially surrounds the mesa as in FIGS. 1–3, very good current spreading can be achieved even where the lower region has a relatively high resistivity as, for example, above about 30 Ohms/sq. Thus, the current spreading effect of the electrode configuration allows efficient operation even with a relatively thin lower region. This minimizes the cost incurred in epitaxial growth.

Moreover, the current spreading effect of the preferred electrode configurations reduces the need for a very low resistance top electrode, which facilitates the use of a very thin top electrode as, for example, an nickel-gold transparent electrode having resisitivity above about 20 Ohm-cm, most typically about 20–50 Ohm-cm as, for example about 40 Ohm-cm. This, in turn, makes it easier to provide a top electrode which is highly transparent.

The efficient current spreading afforded by the preferred embodiments of the present invention is particularly beneficial where the device is operated at relatively high currents and/or at high temperatures. For example, typical commercially-available square LEDs formed from gallium nitride based semiconductors, with sides about 0.3 mm long and having contacts disposed at opposite corners according to the aforementioned U.S. Pat. No. 5,563,422 exhibit significant current crowding at the n-type electrode with drive currents on the order of 50 mA at room temperature. Dies of the same size with electrode and contact structures as described above with reference to FIGS. 1–3 can be operated at currents up to about 130 mA at room temperature, and up to about 30 mA at 55° C. without any visible current crowding.

Moreover, the efficient current spreading afforded by preferred embodiments of the present invention facilitates the use of relatively large dies. Square dies up to 0.7 mm have been operated at up to 300 mA at room temperature without visible current crowding. Such large dies and high currents provide enhanced light output.

The transparent top electrode can be omitted in some cases so that the top electrode-pad unit consists only of a pad and an electrode in the area occupied by the pad. This approach can be used, for example, where the first or upper region has relatively low resistance to current flow in the horizontal direction as, for example, where the first or upper region includes a thick layer of semiconductor material. More typically, however, at least in the case of LED's formed from nitride semiconductors such as GaN, the cost and difficulties encountered in growing such a layer to the requisite thickness with good crystal quality outweigh the cost and light transmission efficiency losses associated with the transparent top electrode.

Although the preferred embodiments have been described above with reference to particular semiconductor materials, it should be appreciated that the invention can be applied with dies formed from other semiconductor materials as well. Also, the conductivity types can be reversed, so that in some cases the first or upper region can be formed from n-type semiconductor material whereas the second or lower region may be formed from p-type semiconductor material.

As these and other variations and combinations of the features discussed above can be utilized without departing from the present invention, the foregoing description of the preferred embodiments should be taken by way of illustration rather than by way of limitation of the invention as defined by the claims.

What is claimed is:

1. A light-emitting diode comprising:
   (a) a stacked structure including a first region of a first conductivity type and a second region of a second conductivity type and a light-emitting p-n junction between said regions, said stacked structure defining a lower contact surface and a mesa projecting upwardly from said lower contact surface, said first-conductivity-type region being disposed in said mesa and defining a top surface of said mesa, said second-conductivity-type region defining said lower contact surface, said mesa having a near edge and a far edge parallel -to said near edge and remote from said near edge, said lower contact surface substantially surrounding said mesa;
   (b) a top electrode-pad unit including a transparent top electrode overlying at least a major portion of the top surface of said mesa, said transparent electrode being in contact with said first-type region at said top surface and a top pad overlying only a portion of said transparent electrode adjacent the middle of said far edge of said mesa; and
   (c) a lower electrode-pad unit including a lower electrode in contact with said lower contact surface and substantially surrounding said mesa and a lower pad in contact with said lower electrode adjacent said near edge of said mesa.

2. A light-emitting diode as claimed in claim 1 wherein said lower contact surface faces upwardly.

3. A light-emitting diode as claimed in claim 1 wherein said mesa is generally in the form of a rectilinear solid and said top surface of said mesa is generally rectangular.

4. A light-emitting diode as claimed in claim 3 wherein said top surface of said mesa is generally square.

5. A light-emitting diode as claimed in claim 3 or claim 4 wherein said lower electrode is generally in the form of a rectangular loop substantially surrounding said mesa.

6. A light-emitting diode as claimed in claim 5 wherein said stacked structure defines an indentation in said mesa adjacent the periphery thereof extending downwardly from the top surface of said mesa to said lower contact surface, said lower electrode-pad unit including a lower pad disposed at least partially within said indentation.

7. A light-emitting diode as claimed in claim 6 wherein said indentation extends into said mesa adjacent the middle of said near edge.

8. A light-emitting diode as claimed in claim 1 wherein at least that portion of said first region defining said top surface of said mesa is formed from one or more nitride semiconductors.

9. A light-emitting diode as claimed in claim 1 wherein said first conductivity type is p-type and said second conductivity type is n-type.

10. A light-emitting diode comprising:
    (a) a stacked structure including a first region of a first conductivity type and a second region of a second conductivity type and a light-emitting p-n junction between said regions, said stacked structure defining a lower contact surface and a mesa projecting upwardly from said lower contact surface, said mesa having a near edge extending in a first horizontal direction, said first-conductivity-type region being disposed in said mesa and defining a top surface of said mesa, said second-conductivity-type region defining said lower contact surface, said lower contact surface including a near region adjacent said near edge of said mesa;
    (b) a lower electrode-pad unit including a lower electrode generally in the form of an elongated strip with its length extending in said first horizontal direction alongside said near edge of said mesa and overlying at least a portion of said lower contact surface, said lower electrode overlying said lower contact surface only in said near region; and
    (c) a top electrode-pad unit including a top pad, said top pad overlying only a portion of said mesa, said top pad having an extent in said first horizontal direction less than the length of said lower electrode.

11. A light-emitting diode as claimed in claim 10 wherein said top electrode-pad unit includes a transparent top electrode overlying at least a major portion of the top surface of said mesa, said top pad overlying only a part of the top electrode.

12. A light-emitting diode as claimed in claim 11 wherein said top electrode has a near edge extending bug alongside said near edge of said mesa in said first horizontal direction, and wherein said top pad is disposed remote from said near edges of said top electrode and said mesa.

13. A light-emitting diode as claimed in claim 11 wherein said near edge of said top electrode is substantially coextensive with said strip in said first horizontal direction.

14. A light-emitting diode as claimed in claim 11 wherein said top electrode has a far edge extending in said first horizontal direction remote from said near edge of said mesa and remote from said strip, and wherein said top pad is closer to said far edge than to said near edge.

15. A light-emitting diode as claimed in claim 11 wherein said top pad has an extent, in a second horizontal direction perpendicular to said first horizontal direction, of less than about 50% of the distance between said near edge of said top electrode and said far edge of said top electrode.

16. A light-emitting diode as claimed in claim 15 wherein said top pad has an extent in said first horizontal direction of less than about 30% of the length of said strip.

17. A light-emitting diode as claimed in claim 15 wherein said top pad is substantially in the form of a circular spot.

18. A light-emitting diode as claimed in claim 15 wherein said top pad is aligned in said first horizontal direction with the middle of said strip.

19. A light-emitting diode as claimed in claim 10 wherein said top surface of said mesa and said top electrode are generally rectangular.

20. A light-emitting diode as claimed in claim 19 wherein said top surface of said mesa and said top electrode are generally square.

21. A light-emitting diode as claimed in claim 10 wherein at least that portion of said first-conductivity-type region defining said top surface of said mesa is formed from one or more nitride semiconductors.

22. A light-emitting diode as claimed in claim 21 wherein said first conductivity type is p-type and said second conductivity type is n-type.

23. A light-emitting diode comprising:
    (a) a stacked structure including a first region of a first conductivity type and a second region of a second conductivity type and a light-emitting p-n junction between said regions, said stacked structure defining a lower contact surface and a mesa projecting upwardly from said lower contact surface, said first-conductivity-type region being disposed in said mesa and defining a top surface of said mesa, said second-conductivity-type region defining said lower contact surface; said mesa having a near edge and a far edge extending in a first horizontal direction on opposite sides of said mesa, said mesa having an indentation in said near edge adjacent the midpoint of said near edge extending downwardly from said top surface to said lower contact surface, said mesa having a medial plane midway between said near edge and said far edge, said mesa having a dimension in said first horizontal direction at said medial plane greater than the length of said near edge and greater than the length of said far edge;
    (b) a top electrode-pad unit including a top pad overlying only a portion of said top surface adjacent the midpoint of said far edge; and
    (c) a lower electrode-pad unit including a lower pad having an extent in said first horizontal direction shorter than said near edge, said lower pad being disposed at least partially in said indentation.

24. A light-emitting diode as claimed in claim 23 wherein said top electrode-pad unit includes a transparent top electrode in contact with said top surface of said mesa, said top pad overlying only a portion of said top electrode.

25. A light-emitting diode as claimed in claim 23 wherein said lower electrode-pad unit includes a lower electrode extending within said indentation.

26. A light emitting diode as claimed in claim 25 wherein at least a major portion of said lower electrode is disposed within said indentation.

27. A light-emitting diode as claimed in claim 25 wherein said lower electrode-pad unit is disposed entirely within said indentation.

28. A light-emitting diode as claimed in claim 23 wherein said mesa and said stacked structure are substantially in the form of a regular hexagonal prism, said top surface being generally hexagonal and defining an end surface of said prism, said top surface having a pair of vertices adjacent said medial plane.

29. A light-emitting diode as claimed in claim 23 wherein said indentation occupies about 20% or less of the surface area of said top surface computed without regard for said indentation.

30. A light-emitting diode as claimed in claim 23 wherein at least that portion of said first-type region defining said top surface of said mesa is formed from one or more nitride semiconductors.

31. A light-emitting diode as claimed in claim 30 wherein said first conductivity type is p-type and said second conductivity type is n-type.

* * * * *

UNITED STATES PATENT AND TRADEMARK OFFICE
CERTIFICATE OF CORRECTION

PATENT NO. : 6,642,548 B1 Page 1 of 1
DATED : November 4, 2003
INVENTOR(S) : Michael G. Brown, Ivan Eliashevich and Louis A. Koszi It is certified that error appears in the above-identified patent and that said Letters Patent is hereby corrected as shown below:

<u>Column 8,</u>
Line 4, delete the symbol "=" before the word "mesa."

<u>Column 10,</u>
Line 56, delete the "-" before the word "to."

<u>Column 11,</u>
Line 59, delete the word "bug."

Signed and Sealed this

Twenty-fourth Day of February, 2004

JON W. DUDAS
*Acting Director of the United States Patent and Trademark Office*